United States Patent [19]

Tsutsui et al.

[11] Patent Number: 4,820,930
[45] Date of Patent: Apr. 11, 1989

[54] PHOTOMASK POSITIONING DEVICE

[75] Inventors: Shinji Tsutsui, Kawasaki; Isamu Shimoda, Zama, both of Japan

[73] Assignee: Canon Kabushiki Kaisha, Tokyo, Japan

[21] Appl. No.: 94,088

[22] Filed: Sep. 4, 1987

Related U.S. Application Data

[63] Continuation of Ser. No. 746,102, Jun. 18, 1985, abandoned.

[30] Foreign Application Priority Data

| Jun. 20, 1984 | [JP] | Japan | 59-126971 |
| Jun. 20, 1984 | [JP] | Japan | 59-126972 |
| May 27, 1985 | [JP] | Japan | 60-113909 |

[51] Int. Cl.$^4$ ............................................. G01N 21/86
[52] U.S. Cl. ..................................... 250/548; 414/416
[58] Field of Search ............... 356/400, 401; 250/548, 250/557; 414/416, 417

[56] References Cited

U.S. PATENT DOCUMENTS

| 4,311,427 | 1/1982 | Coad et al. | 414/417 |
| 4,441,853 | 4/1984 | Kosugi | 414/757 |
| 4,493,606 | 1/1985 | Foulke et al. | 414/416 |
| 4,549,843 | 10/1985 | Jagusch et al. | 414/416 |

OTHER PUBLICATIONS

IBM Technical Disclosure Bulletin (Caccoma et al.), vol. 17, No. 12 (May 1975), p. 3577.

Primary Examiner—David C. Nelms
Attorney, Agent, or Firm—Fitzpatrick, Cella, Harper & Scinto

[57] ABSTRACT

A positioning device for positioning a mask having formed thereon a pattern to be transferred onto a semiconductor wafer. On the basis of a peripheral shape of the mask, the positioning device positions the mask so that a center of the mask is brought into alignment with a center of rotation of a holder for holding the mask. The positioning device includes a plurality of engaging pins to be engaged by the periphery of the mask, each engaging pin being movable in a direction toward the center of rotation of the mask holder. Movement of each of the engaging pins is controlled independently from the others, whereby the mask can be positioned irrespective of its size and/or shape.

26 Claims, 6 Drawing Sheets

PHOTOMASK POSITIONING DEVICE

This application is a continuation of application Ser. No. 746,102 filed June 18, 1985, now abandoned.

BACKGROUND OF THE INVENTION

This invention relates to a positioning device for positioning an article in alignment with a predetermined point on the basis of the peripheral shape of the article. More particularly, the invention is concerned with a positioning device for positioning a photomask or reticle having a pattern to be transferred onto a semiconductor wafer, in alignment with the center of rotation of a rotatable mask holder.

In the field of manufacture of semiconductor devices such as integrated circuits, the photomask or reticle (which hereinafter will be referred to simply as "mask") having a pattern to be transferred onto the semiconductor wafer is positioned in its place on the basis of the peripheral shape thereof. This is also the case with the semiconductor wafer. For example, in a projection type exposure apparatus for exposing the wafer to the pattern of the mask, each of the mask and the wafer is pre-positioned on the basis of its peripheral shape before it is moved to the pattern transfer station. By this pre-positioning, the center of the mask or the wafer is aligned with the center of rotation of a holder for holding the mask or the wafer.

The mechanism for such pre-positioning usually includes a plurality of positioning pins which are adapted to engage with the peripheral edge of the mask or the wafer. If these positioning pins are fixed relative to the holder, it is possible that the edge portion of the mask or the wafer may impinge against these positioning pins when the mask or wafer is moved to the holder. This is undesirable.

It has been proposed to make these positioning pins movable relative to the holder, such as disclosed in IBM Technical Disclosure Bulletin Vol. 17, No. 12, p. 3577 published May 1975. The proposed positioning device includes six positioning pins which are retractable radially outwardly with respect to a holder or chuck. With this arrangement, the problem as described above can be obviated. However, since these six positioning pins are driven by a common cam, there still remain the following problems. First, the proposed positioning device could not easily meet the change in size and/or shape of the wafer or the mask. This is a significant disadvantage because, in recent years, masks of rectangular shape and masks of circular shape are used in the same exposure apparatus and because there is a tendency in production to increase the diameter of each of the wafer and the mask.

Second, a large cam is required to drive the positioning pins, which leads to bulkiness of the positioning device. This is particularly undesirable where the positioning device is to be incorporated into the exposure apparatus.

SUMMARY OF THE INVENTION

It is accordingly a primary object of the present invention to provide a positioning device which can easily meet any change in size and/or shape of an article which is to be positioned by the positioning device on the basis of the peripheral shape of the article.

It is another object of the present invention to provide a positioning device by which accurate positioning of an article on the basis of its peripheral shape is assured.

It is a further object of the present invention to provide a positioning device for use with a semiconductor device manufacturing apparatus, by which positioning device a mask having a pattern for preparing semiconductor devices can be appropriately positioned in alignment with a predetermined point when it is to be introduced into the semiconductor device manufacturing apparatus.

Briefly, according to one preferred form of the present invention, there is provided a positioning device for positioning a mask having formed thereon a pattern to be transferred onto a semiconductor wafer. On the basis of a peripheral shape of the mask, the positioning device positions the mask so that a center of the mask is brought into alignment with a center of rotation of a holder for holding the mask. The positioning device includes a plurality of engaging pins to be engaged by the periphery of the mask, each engaging pin being movable in a direction toward the center of rotation of the mask holder. Movement of each of the engaging pins is controlled independently from the others, whereby the mask can be positioned irrespective of its size and/or shape.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1A:
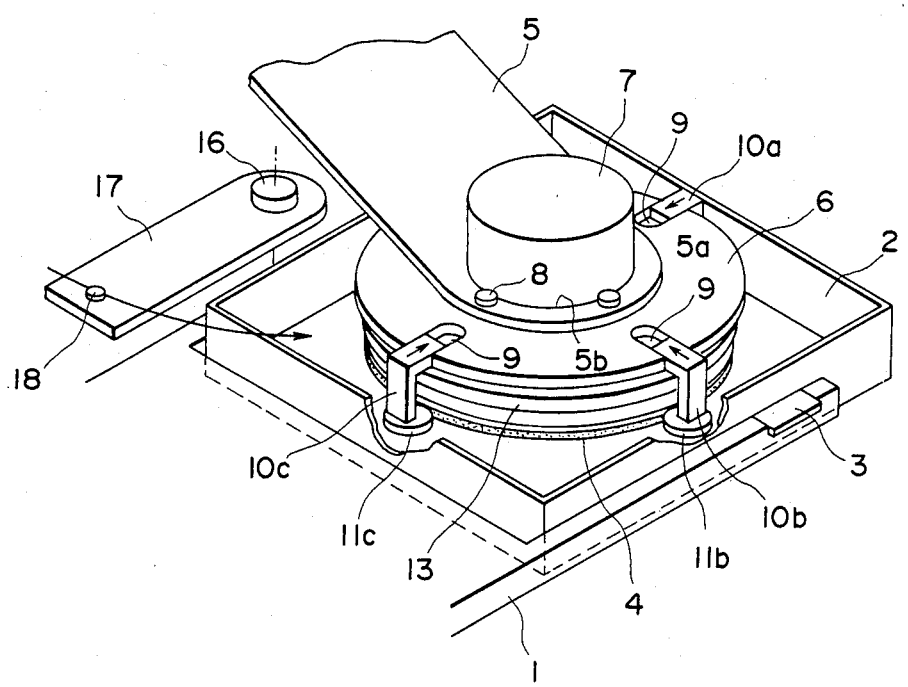
FIGS. 1A and 1B are perspective views showing, respectively, a positioning device according to an embodiment of the present invention.
Figure 1B:
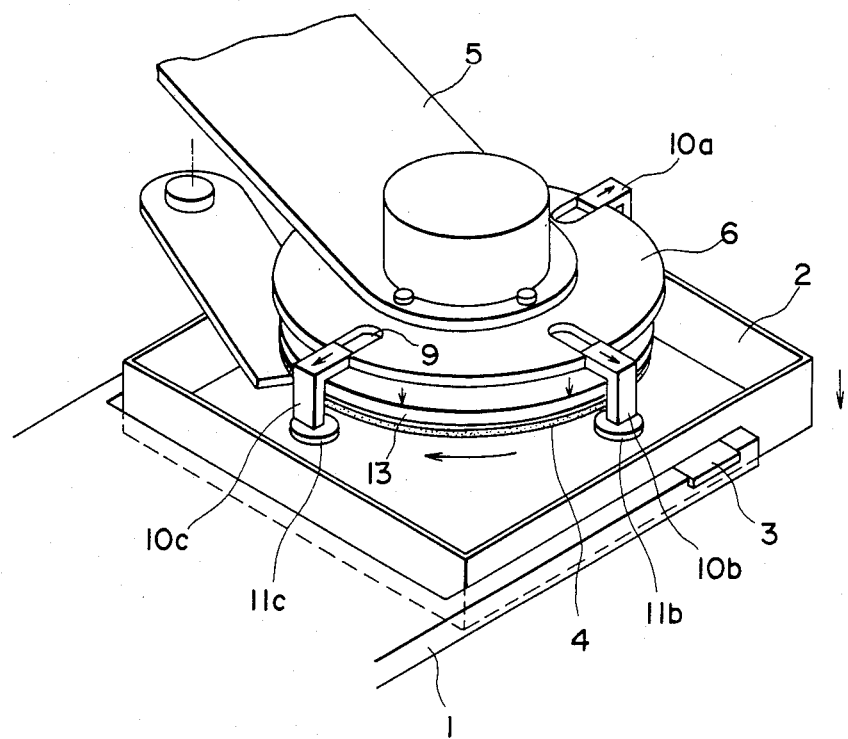

Referring to FIGS. 1A and 1B, there is shown a positioning device according to an embodiment of the present invention, which positioning device is adapted to position a mask in an operation for introducing the mask into a projection type exposure apparatus.

In FIGS. 1A and 1B, the mask as denoted at 4 is contained in a mask cassette composed of an upper member such as a lid (not shown) and a lower member such as a tray 2. The mask 4 has a circular outer shape.

Although not shown in the drawings, there are a plurality of masks such as the mask 4, and these masks are contained in respective mask cassettes. These mask cassettes are stacked within an unshown mask carrier of the projection exposure apparatus. When a desired one of the masks, such as the mask 4, is to be fed to a mask chuck provided on a mask stage, a cassette feeding fork 1 having a forked end is inserted into the mask carrier (not shown) so that the forked end engages with two protrudent tabs 3 (only one is illustrated) formed on the side surfaces of the tray 2. Then, by retracting the cassette feeding fork 1, the tray 2 together with the mask 4 are taken out from the mask carrier. The tray 2 as well as the mask 4 are thereafter moved to an automatic mask positioning station which is a station as established in FIGS. 1 and 2.

At the automatic mask positioning station, a mask positioning mechanism stands by, which mechanism is supported as shown in FIG. 1A by a mask feeding arm 5 for feeding the mask 4 to the mask chuck. The mask feeding arm 5 has an end portion 5a through which an aperture 5b is formed. A base plate 6 having a circular peripheral shape is formed with a central protrusion 7 of hollow cylindrical shape. The base plate 6 is fixedly secured to the end portion 5a of the arm 5 by screws 8 with the cylindrical protrusion 7 extending through the aperture 5b of the arm 5. Four notches 9 (only three are illustrated) are formed in the peripheral portion of the base plate 6 at positions equidistantly spaced from each other in the peripheral direction. The positioning device further includes four pressing arms 10a–10d adapted to engage with the peripheral edge of the mask 4 to center it, i.e. to position the mask 4 in the X and Y directions. As shown in FIGS. 1A and 1B, a portion of each of the pressing arms 10a–10d slidably engages with a corresponding one of the notches 9 of the base plate 6. Further, each of the pressing arms 10a–10d has, on its end, a roller 11a, 11b, 11c or 11d (only three are illustrated) adapted to abut against the peripheral edge of the mask 4. These rollers 11a–11d are made rotatable to prevent any damage of the mask 4 when they abut on the peripheral edge of the mask 4.

Figure 2A:
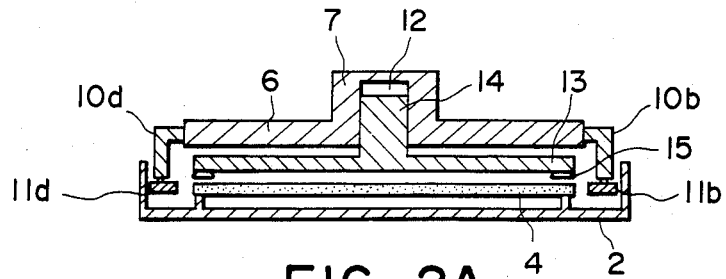
FIGS. 2A, 2B, 2C and 2D are schematic and sectional views for showing the flow of operation of the positioning device according to the embodiment of the present invention as shown in FIGS. 1A and 1B.

The cylindrical protrusion 7 of the base plate 6 has an inner hollow portion 12 (FIG. 2A). A holder 13 of circular shape has at its center a shaft portion 14 which is rotatably supported within the hollow portion 12 of the cylindrical protrusion 7. The holder 13 has vacuum suction pads 15 mounted on a lower surface of the peripheral portion of the holder 13. These suction pads 15 are adapted to be contacted to the back surface of the mask 4, i.e. the surface of the mask 4 on which no circuit pattern is formed, to thereby hold the mask 4. Preferably, three or four vacuum suction pads 15 are provided at positions equidistantly spaced from each other in the peripheral direction of the holder 13.

At the mask positioning station, there is also provided a detecting mechanism for detecting the position of the mask in the rotational direction ($\theta$ direction). This position detecting mechanism is operable in relation to the above-described mask positioning mechanism connected to the mask feeding arm 5. The position detecting mechanism includes an arm 17 rotatively movable about a shaft 16 and a reflection type photoelectric sensor 18 disposed at an end portion of the arm 17 remote from the shaft 16. The arm 17 has a sufficient length so that, when the arm 17 is rotatively moved about the shaft 16, the sensor 18 reaches the position under the peripheral portion of the mask 4 held by the vacuum suction pads 15.

The operation of the mask positioning device according to this embodiment of the present invention will now be described with reference to FIGS. 2A–2D. As described hereinbefore, the mask, 4, while it is placed within the tray 2 of the mask cassette, is conveyed to the positioning station by the fork 1. Then, as shown in FIG. 2A, the mask positioning mechanism supported by the mask feeding arm 5 is moved downwardly until the rollers 11a–11d of the pressing arms 10a–10d reach the same height as of the peripheral edge of the mask 4.

Figure 2B:
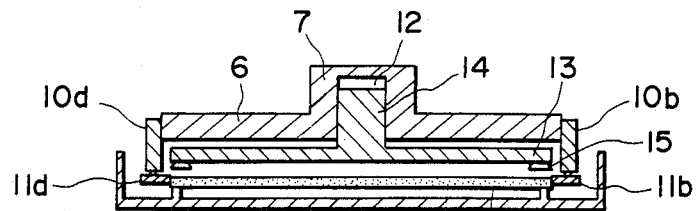
Figure 2C:
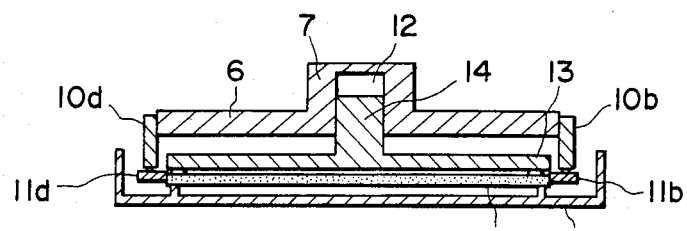

Subsequently, as shown by arrows in FIG. 1A, these pressing arms 10a–10d are displaced toward the center of rotation of the holder 13 until the rollers 11a–11d are brought into abutment with the mask 4 to support the same (see FIGS. 2B). When this is achieved, the positioning or centering of the mask 4 on the basis of the peripheral shape of the mask 4 is accomplished, and the center of the mask 4 is positioned in alignment with the center of rotation of the holder 13. Details of the operation for such centering will be described later.

Subsequent to the centering of the mask 4, i.e. the positioning of the mask 4 in the X and Y directions, the holder 13 is moved downwardly while pressing arms 10a–10d are maintained in their positions, until the vacuum suction pads 15 contact the upper surface (which is a back) of the mask 4 to hold it. When this is achieved, the pressing arms 10a–10d are simultaneously displaced radially outwardly as shown by arrows in FIG. 1B so that the rollers 11a–11d are separated from the mask 4.

Figure 2D:
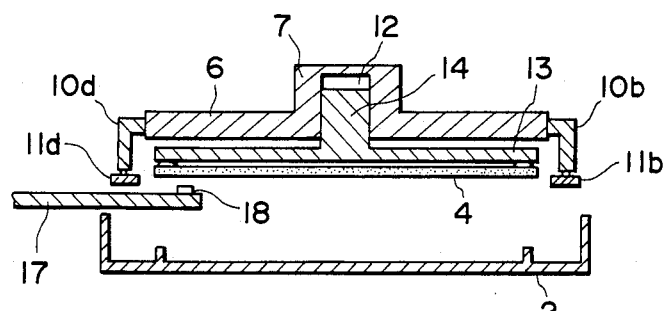

Then, as shown in FIG. 2D, the tray 2 of the mask cassette is moved downwardly by the fork 1 to a position at which a sufficient distance is established between the mask positioning mechanism and the tray 2. Subsequently, the arm 17 is rotatively moved about the shaft 16 so that the sensor 18 is displaced to a position between the mask 4 and the tray 2 and under the peripheral portion of the mask 4.

The detection of the position of the mask in the $\theta$ direction will now be described with reference to FIGS. 3 and 4.

Figure 3:
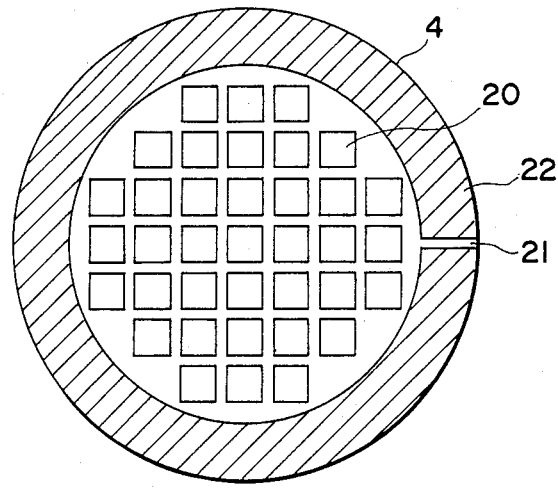
FIG. 3 is a plan view showing an example of a mask which is to be positioned by the positioning device of the present invention.

FIG. 3 is a plan view showing an example of a mask, such as the mask 4, suitably arranged for the sake of automatic position detection. More specifically, the mask 4 has formed on its surface a number of circuit patterns 20 to be transferred onto an unshown wafer and a position detecting pattern 21 to be used for the purpose of automatic position detection of the mask 4 with respect to the $\theta$ direction. Except for the area of the position detecting pattern 21, a peripheral area 22 of the mask 4 substantially encircling the circuit patterns 20 is made non-transmissive to the light. On the other hand, only the position detecting pattern area 21 is made transmissive to the light. When the holder 13 rotates, thus rotating the mask 4, the position detecting pattern 21 formed at the peripheral portion of the mask 4 passes the position above the sensor 18. When this occurs, the quantity of light detected by the sensor 18 changes. Accordingly, the position of the mask 4 in the rotational direction can be detected.

Figure 4:
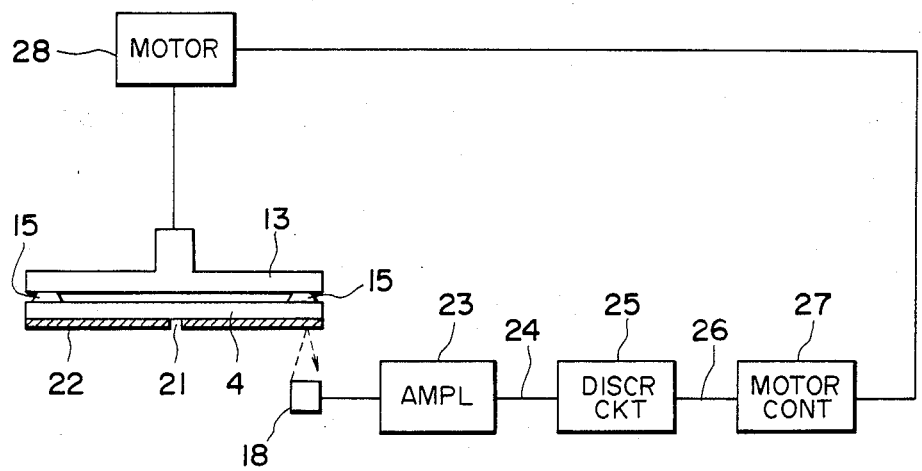
FIG. 4 is a schematic and diagrammatic view showing a detection system of the positioning device, for detecting the positional deviation, in the rotational direction, of the mask.

FIG. 4 is a block diagram showing an example of an electric circuit for effecting the position detection with respect to the $\theta$ direction. An electric signal obtained from the photoelectric conversion by the reflection type sensor 18 is applied to an amplifier 23 whereby it is amplified. An output of the amplifier 23 which is an amplified signal is inputted to a discrimination circuit 25. The discrimination circuit 25 is adapted to detect the change in level of the signal from a level corresponding to the non-transmissive area 22 of the wafer to a level corresponding to the transparent area 21 (the position detecting pattern area) of the wafer. An output signal 26 of the discrimination circuit 25 is applied to a motor control circuit 27 which controls a motor 28 for rotating the holder 13. When the change in level of the signal 24 from the level corresponding to the non-transmissive area 22 to the level corresponding to the transparent area 21 is discriminated, the motor control circuit 27 is actuated to stop the rotation of the motor 28, thereby to stop the rotation of the holder 13.

Thus, by selecting an appropriate position as the sensor 18 position, a desired position of the mask 4 in the $\theta$ direction can be indexed accurately and easily.

Figure 5:
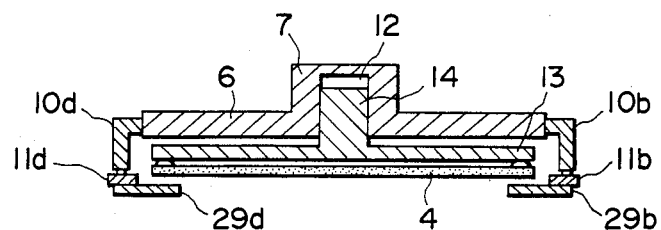
FIG. 5 is a schematic and sectional view showing a positioning device according to another embodiment of the present invention.

When the positioning of the mask 4 in the X and Y directions and the positioning of the same in the $\theta$ direction are completed, the arm 17 is moved back to its initial position and the mask 4, while being held by the vacuum suction pads 15, is conveyed to an unshown mask stage. Preferably, each of the pressing arms 10a–10d is provided with a pawl member (only two of these pawl members being illustrated in FIG. 5 with numerals 29b and 29d) which is retractable radially outwardly. These pawl members are provided in order to prevent damage of the mask 4 due to a possible drop of the mask even when it is released, during conveyance, from the vacuum suction pads 15 for some reason.

Figure 6:
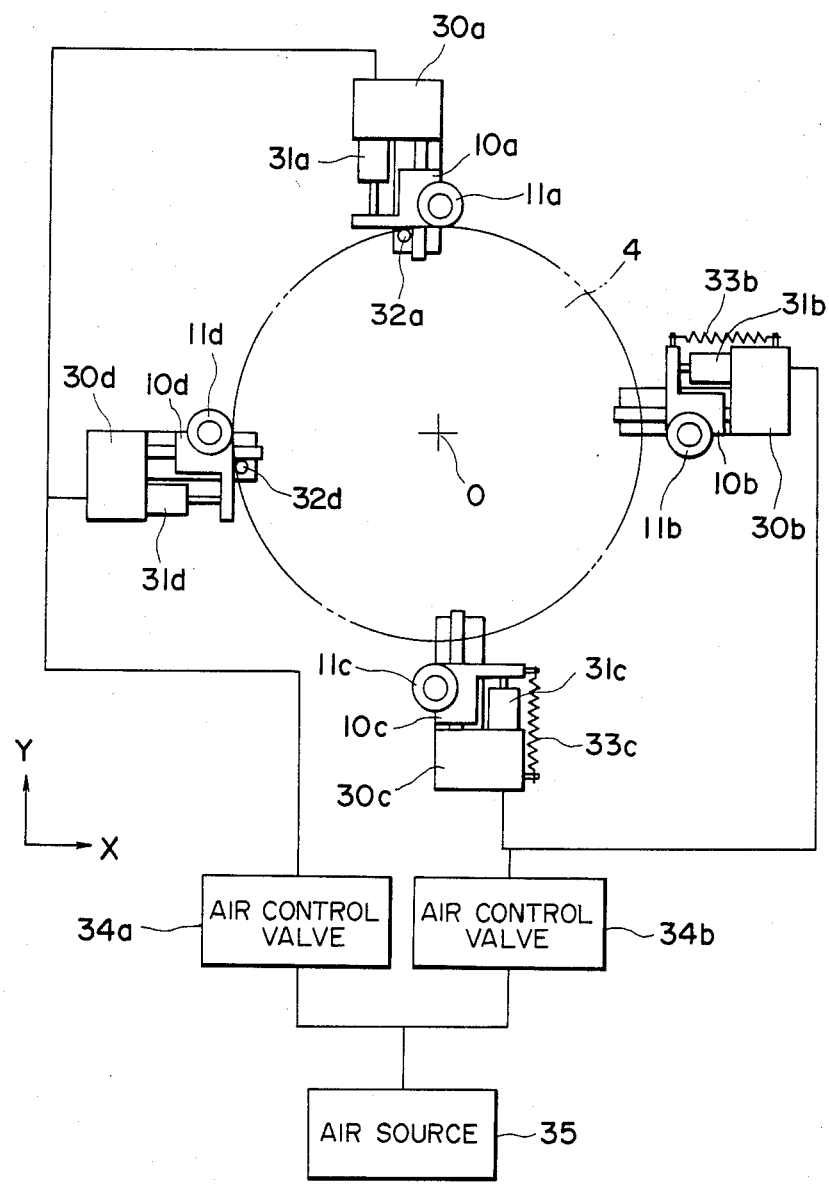
FIG. 6 is a schematic and diagrammatic view showing a roller driving system of the positioning device according to the embodiment of the present invention as shown in FIGS. 1A and 1B.

Referring to FIG. 6, the arrangement of the positioning device for effecting the centering of the mask will now be described in more detail. As shown in FIG. 6, the mechanism includes four support members 30a–30d supporting the pressing arms 10a–10d, respectively, for radial displacement with respect to the center of rotation O of the mask holder 13, and four air cylinders 31a–31d for driving the pressing arms 10a–10d, respectively. Each of the support members 30a–30d is fixedly secured to the base plate 6 (FIG. 1A) and supports an associated one of the air cylinders 31a–31d, as shown in FIG. 6. Fixedly mounted on each of the support members 30a and 30d is a limitation pin 32a (or 32d) for limiting the displacement, in the direction toward the center O of the rotation of the mask holder 13, of corresponding one of the rollers 11a and 11d supported respectively by the pressing arms 10a and 10d. Each of the positions of the rollers 11a and 11d established when the displacements of these rollers are limited by the pins 32a and 32d defines a reference position for the centering of the mask. On the other hand, the roller 11b is adapted to urge the mask 4 in the X direction, i.e. in the direction abutting the mask 4 against the roller 11d, while the roller 11c is adapted to urge the mask 4 in the Y direction, i.e. in the direction abutting the mask 4 against the roller 11a. Each of the pressing arms 10b and 10c supporting the rollers 11b and 11c, respectively, is provided with a coiled spring 33b (or 33c). Each of the springs 33b and 33c produces a biasing force which acts against the arm pressing force produced by the air cylinder 31b (or 31c) when it is actuated to move the pressing arm 10b (or 10c) toward the center O of the rotation of the mask holder 13. With this arrangement, the mask urging force of each of the rollers 11b and 11c, produced during the centering operation for the mask 4, is smaller than that of each of the rollers 11a and 11d. This is for the sake of prevention of inaccurate positioning.

That is, if the urging forces of the rollers 11a–11d are equal to each other, the urging forces applied to the mask 4 may be balanced before the arms 10a and 10d reaches the limitation pins 32a and 32d, respectively, due to friction forces between the mask 4 and the elements supporting the mask 4 or any other reason. This results in inaccurate positioning or centering of the mask 4.

The positioning device further includes an air source 35 for supplying an air pressure and two air control valves 34a and 34b each for controlling the flow of the air pressure supplied from the air source 35. More specifically, the control valve 34a is adapted to control simultaneously the displacements of the rollers 11a and 11d by way of the air cylinders 31a and 31d, while the control valve 34b is adapted to control simultaneously the displacements of the rollers 11b and 11c by way of the air cylinders 31b and 31c. The separate control valves 34a and 34b are provided in order that the set of rollers 11a and 11d, which define the references for the mask centering when their displacements are limited, and the other set of rollers 11b and 11c for urging the mask 4 toward the reference rollers 11a and 11d can be controlled independently from each other.

Figure 7A:
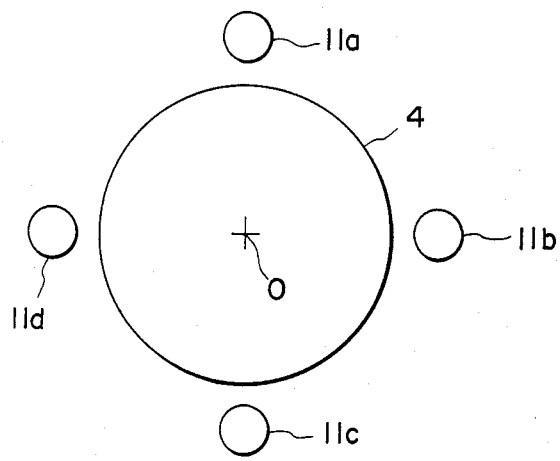
FIGS. 7A, 7B and 7C are schematic views for showing the flow of movement of rollers of the roller driving system shown in FIG. 6.
Figure 7B:
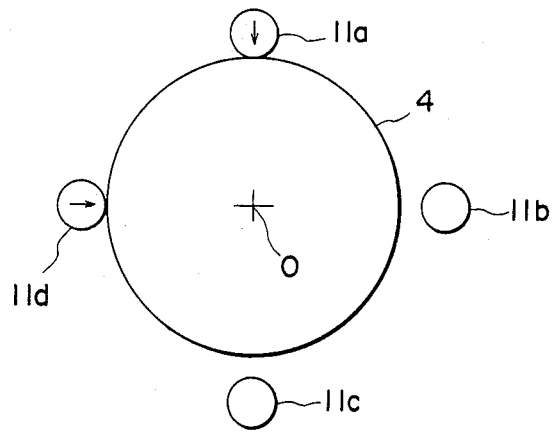
Figure 7C:
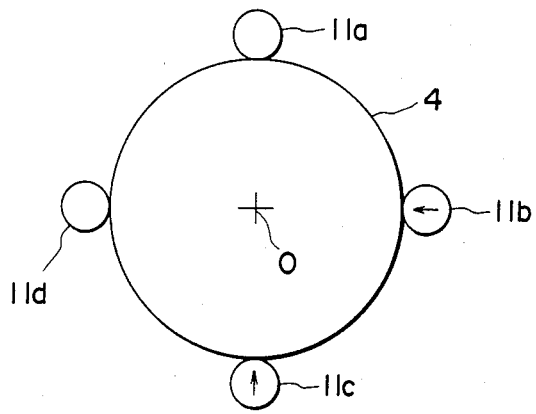

In the centering operation, the rollers 11a and 11d are first moved to the positions shown in FIG. 7B from the positions shown in FIG. 7A by the air pressure supplied from the control valve 34a. At these positions, the displacements of the rollers 11a and 11d are limited by the pins 32a and 32d, respectively. After the rollers 11a and 11d reach the FIG. 7B positions so that they are at the reference positions, the other pair of rollers 11b and 11c are moved to the positions shown in FIG. 7C from the positions shown in FIG. 7A by the air pressure supplied from the control valve 34b. Since the urging forces of the rollers 11b and 11c are smaller than those of the rollers 11a and 11d, the rollers 11b and 11c function to bring the mask 4 into engagement with and/or keep the mask 4 in engagement with the rollers 11a and 11d which are now stationary at the reference positions.

With the arrangement and operation of the positioning device according to this embodiment of the present invention, the mask 4 can be positioned or centered with higher accuracies and higher reliabilities. If, to the contrary, all the rollers 11a–11d are driven simultaneously, there would occur unnecessary movement of the mask 4 until the urging forces of the rollers are balanced. This would result in degradation in the positioning accuracies and reliabilities.

Since the operation to be made after the center of the mask 4 is positioned in alignment with the center of rotation of the holder 13 has already been described with reference to FIGS. 2A–2D, description thereof is omitted here to prevent duplication.

While, in the present embodiments, the invention has been described with reference to the positioning of the mask, the invention is applicable also to the positioning of a wafer. Further, although in the present embodiments each of the rollers has its own drive source (air cylinder) and those of the drive sources as having a predetermined correlation are controlled simultaneously, each of the drive sources may be controlled independently from the others.

In accordance with the present invention, as has hitherto been described, movement of each of the rollers can be controlled independently from the others. Accordingly, the positioning device can easily meet any change in size the and/or shape of an article which is to be positioned by the positioning device. Further, the positioning device can be maintained compact.

While the invention has been described with reference to the structures disclosed herein, it is not confined to the details set forth and this application is intended to cover such modifications or changes as may come within the purposes of the improvements or the scope of the following claims.

What is claimed is:

1. a positioning device for positioning an article, comprising:
   means for holding the article;
   means for positioning the article so that a center of the article is brought into alignment with a predetermined point on said holding means, said positioning means having a first engaging member movable toward the article to move toward and engage the article and to provide a positional reference for the article on the holder, and a second engaging member for acting on the article;
   means for driving said first and second engaging members, said driving means having a first drive source for driving said first engaging member and a second drive source for driving said second engaging member, such that the article is brought into engagement with said first engaging member at said positional reference in response to operation of said first and second drive sources; and
   means for controlling said first and second drive sources.

2. A device according to claim 1, wherein said positioning means positions the article with respect to said first engaging member when said first engaging member is in engagement with the article.

3. A device according to claim 2, wherein said positioning means includes a member for limiting the movement of said first engaging member, thus for determining the position of said first engaging member.

4. A device according to claim 3, wherein said second engaging member has an urging force, to be applied to the article, which is smaller than that of said first engaging member to be applied to the article.

5. A device according to claim 4, wherein said positioning means includes a member for applying to said second engaging member a biasing force acting against said second drive source during the positioning of the article.

6. A device according to claim 5, wherein said controlling means controls said first and second drive sources so that the drive of said second engaging member by said second drive source is initiated after the drive of said first engaging member by said first drive source is initiated.

7. A device according to claim 6, wherein said driving means drives said first and second engaging members toward the predetermined point on said holding means.

8. A device according to claim 1, wherein said holding means is rotatable about the predetermined point thereon.

9. A device according to claim 8, wherein said positioning means includes means for determining the position, in a rotational direction, of the article rotatively held by said holding means.

10. A device according to claim 9, wherein said position determining means photoelectrically detects the article.

11. A device according to claim 1, wherein said holding means is supported movably.

12. A device according to claim 11, wherein said holding means holds the article from above.

13. A device according to claim 12, wherein said holding means holds the article by vacuum suction.

14. A device according to claim 13, wherein said positioning means includes a member for preventing separation of the article from said holding means.

15. A positioning device for positioning an article, comprising:
   first positioning means movable toward the article to engage and move the article, and for providing a positional reference for the article;
   first driving means for actuating said first positioning means;
   second positioning means for urging the article so that it engages with said first positioning means, to thereby position the article; and
   second driving means for actuating said second positioning means.

16. A device according to claim 15, wherein said second positioning means includes an engaging member adapted to engage with and press the article 17. A device according to claim 15, further comprising controlling means for controlling said first and second driving means.

18. A device according to claim 17, wherein said controlling means is arranged to control said first and second driving means so that said first driving means is first operated to position the article and that, after completion of the positioning by said first driving means, said second driving means is operated.

19. A positioning device for positioning an article, comprising:
   first positioning means movable toward the article to engage and move the article, and for providing a positional reference for the article;
   second positioning means for urging the article in a direction toward said first postiioning means; and
   controlling means for controlling said first and second positioning means such that the movement of the article by said first positioning means is completed prior to the completion of the urging operation of said second positioning means.

20. A device according to claim 19, wherein said controlling means is arranged to control said first and second positioning means such that the movement of the article by said first positioning means is completed prior to the initiation of the urging operation of said second positioning means.

21. A handling system for handling an article, said system comprising:
   a mechanical arm operable to displace the article from a first position to a second position, said mechanical arm having (i) holding means operable to hold the article, (ii) centering means operable prior to the holding of the article by said holding means to center the article with respect to a center of said holding means and (iii) driving means operable to move, in a rotational direction, said holding means by which the article is being held; and
   detecting means for detecting the position of the article in said rotational direction.

22. A handling system according to claim 21, wherein said holding means is moved rotationally by said driving means about a predetermined point.

23. A handling system according to claim 22, wherein said detecting means includes a photoelectric sensor for photoelectrically detecting the position of the article.

24. A handling system according to claim 21, wherein said holding means is movably supported by said mechanical arm.

25. A handling system according to claim 24, wherein said holding means is placed above the article at the time of the centering of the article.

26. A handling system according to claim 25, wherein said centering means has a limiting member effective to limit separation of the article form said holding means.

* * * * *

UNITED STATES PATENT AND TRADEMARK OFFICE
CERTIFICATE OF CORRECTION

PATENT NO. : 4,820,930
DATED : April 11, 1989
INVENTOR(S) : SHINJI TSUTSUI, ET AL.

It is certified that error appears in the above-identified patent and that said Letters Patent is hereby corrected as shown below:

COLUMN 4

Line 6, "mask, 4," should read --mask 4,--.
    Line 12, "of" (first occurrence) should be deleted.

COLUMN 5

Line 44, "center O of the rotation" should read
        --center of rotation O-- and "of corre-"
        should read --of the corre- --.
    Line 61, "center O of the rotation" should read
        --center of rotation O--.

COLUMN 6

Line 2, "reaches" should read --reach--.
    Line 66, "size the" should read --the size--.

COLUMN 7

Line 8, "a" should read --A--.

UNITED STATES PATENT AND TRADEMARK OFFICE
CERTIFICATE OF CORRECTION

PATENT NO. : 4,820,930
DATED : April 11, 1989
INVENTOR(S) : SHINJI TSUTSUI, ET AL.  Page 2 of 2

It is certified that error appears in the above-identified patent and that said Letters Patent is hereby corrected as shown below:

COLUMN 8

Line 38, "postiioning" should read --positioning--.

COLUMN 10

Line 5, "form" should read --from--.

Signed and Sealed this

Twentieth Day of February, 1990

*Attest:*

JEFFREY M. SAMUELS

*Attesting Officer*   *Acting Commissioner of Patents and Trademarks*